US 6,882,221 B2

(12) United States Patent
Schreyer et al.

(10) Patent No.: US 6,882,221 B2
(45) Date of Patent: Apr. 19, 2005

(54) DIGITAL PREDISTORTION FOR POWER AMPLIFIER

(75) Inventors: George W. Schreyer, Torrance, CA (US); James C. Becker, Torrance, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 28 days.

(21) Appl. No.: 10/668,135

(22) Filed: Sep. 22, 2003

(65) Prior Publication Data

US 2005/0062531 A1 Mar. 24, 2005

(51) Int. Cl.[7] .............................. H03F 1/26; H04L 25/03
(52) U.S. Cl. ....................... 330/149; 375/296; 455/63.1
(58) Field of Search ............................ 330/2, 136, 149; 375/296, 297; 455/63.1, 114.3, 126, 127

(56) References Cited

U.S. PATENT DOCUMENTS

| | | | |
|---|---|---|---|
| 5,867,065 A | | 2/1999 | Leyendecker |
| 5,892,397 A | * | 4/1999 | Belcher et al. .............. 330/149 |
| 6,141,390 A | * | 10/2000 | Cova ........................... 330/149 |
| 6,246,286 B1 | * | 6/2001 | Persson ....................... 330/149 |

* cited by examiner

*Primary Examiner*—Khanh V. Nguyen
(74) *Attorney, Agent, or Firm*—Noel F. Heal

(57) ABSTRACT

Apparatus and a corresponding method for predistorting an input signal applied to a radio frequency (RF) power amplifier, to compensate for amplifier distortion at high powers. The RF amplifier input and output signals are continuously monitored and difference signals are generated in an RF phase discriminator. The difference signals are converted to digital form and stored in a lookup table in the form of running averages of an RF amplifier gain compression value and an RF amplifier output phase value for each observed RF input power value. A predistorter module retrieves these values and predistorts the RF amplifier input by way of compensation.

14 Claims, 1 Drawing Sheet

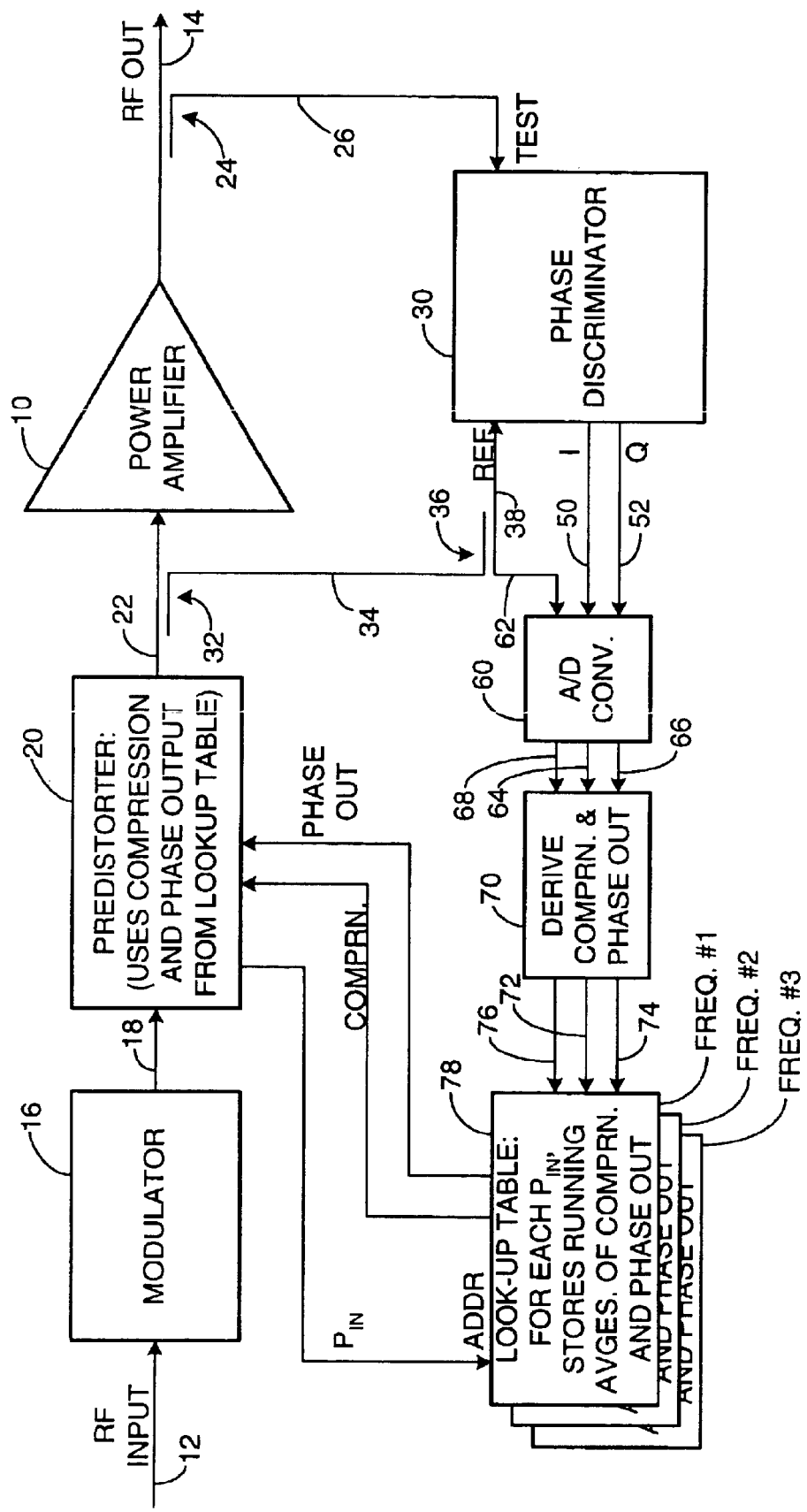

DIGITAL PREDISTORTION FOR POWER AMPLIFIER

BACKGROUND OF THE INVENTION

The present invention relates generally to amplifiers and, more particularly, to power amplifiers used in communication systems, such as in base stations of two-way communications systems. It is well known that power amplifications stages of typical radio frequency (RF) transmitters behave in a nonlinear fashion when operated near peak capacity. Amplifiers have a linear region of operation at low powers. That is to say, at low input and output powers, the power of the output signal is linearly related to the power of the input signal. As an amplifier is driven at increasing power levels, a graph relating its output and input powers exhibits a characteristic "drop-off" and the output power is no longer linearly related to the input power.

A simple solution to this problem is to require that the power amplifier be operated only in the linear region below its saturation point. Backing off a power amplifier in this fashion requires that a larger, higher powered and more expensive device is needed to achieve a given output power. Also, even if an amplifier is backed off to operate in its linear region, there may still be a problem with phase distortion, which may be of concern when modulation schemes that rely in part on phase modulation are used.

Therefore, amplifier designers have devised various techniques to compensate for the distortion that characterizes of operation in the nonlinear region. One technique known in the art uses predistortion of the amplifier input. U.S. Pat. No. 5,867,065 issued to Leyendecker discloses a technique for predistortion in a linear transmitter amplifier used in a pager. Predistortion in the Leyendecker transmitter is performed on the digitally modulated input signals at baseband frequency. Then the predistorted signals are upconverted to an intermediate frequency and used to modulate an RF carrier that is input to the power amplifier. For use in the predistortion process, a portion of the amplifier output is demodulated from the carrier and downconverted to baseband again. This technique of predistortion requires at least one local oscillator, and control circuitry such as a phase locked loop to maintain the upconversion, downconverstion, modulation and demodulation in synchronism. The circuitry needed to support digital predistortion at of the baseband signals is, therefore, relatively complex. Moreover, the specific digital predistortion process is dependent on the type of digital modulation employed.

The goal of the present invention is to provide a much simpler technique for predistortion of a power amplifier, without the need for complex supporting components, such as local oscillators and timing circuitry. A related goal is to provide a predistortion technique that is independent of the specific type of modulation employed.

SUMMARY OF THE INVENTION

The present invention resides in a method and apparatus for direct predistortion of a power amplifier, that is, by applying the predistortion at carrier frequency rather than at baseband. Briefly, and in general terms, the method of the invention compares the input and output powers of a power amplifier at the carrier frequency (RF) at which the amplifier is used to amplify a transmitter signal.

More specifically, the apparatus of the invention comprises an RF phase discriminator, for generating output signals indicative of phase and amplitude differences between two input signals; means for coupling a portion of an RF amplifier input as a first input signal to the RF phase discriminator, means for coupling a portion of an RF amplifier output as a second input signal to the RF phase discriminator, wherein the coupled portion of the RF amplifier output is scaled to be comparable with the RF amplifier input; and an analog-to-digital converter for converting difference signals generated by the RF phase discriminator to digital form. The apparatus also comprises a computation module for deriving from the difference signals corresponding values of gain compression and RF amplifier output phase; means for coupling a portion of the RF amplifier input to the analog-to-digital converter, to derive RF amplifier input values in digital form; a digital memory, for storing in association with each other, values of RF amplifier input, gain compression and RF amplifier output phase; and an amplifier predistorter, for adjusting the amplitude and phase of the RF amplifier input based on the stored values of gain compression and RF amplifier output phase, to compensate for distortion in the RF amplifier.

In terms of a novel method, the invention comprises the steps of coupling a portion of an RF amplifier input as a first input signal to an RF phase discriminator; coupling a portion of an RF amplifier output as a second input signal to the RF phase discriminator, wherein this coupling step includes scaling the RF amplifier output to be comparable with the RF amplifier input; and generating, in the RF phase discriminator, output signals containing information indicative of phase and amplitude differences between the first and second input signals. The method further comprises converting, in an analog-to-digital converter, the RF phase discriminator output difference signals from analog to digital form; computing from the digital difference signals corresponding values of RF amplifier gain compression and RF amplifier output phase; storing, in association with each other in a lookup table, values of RF amplifier input, amplifier gain compression and amplifier output phase; and predistorting the RF amplifier input in amplitude and phase, based on the stored values of gain compression and amplifier output phase associated with a desired value of RF amplifier input. Preferably, these stored values are running averages and, therefore, represent distortion measured over a selected period of time. Therefore, the amount of predistortion applied to the amplifier adapts to amplifier changes due, for example, to component aging or environmental conditions.

It will be appreciated from the foregoing that the present invention represents a significant advance over amplifier predistortion techniques used in the past. In particular, the present invention achieves compensation for amplifier distortion by computing predistortion parameters based on measurements of RF amplifier input and output signals. Therefore, the technique is relatively simple to implement and is independent of the form of modulation employed. Other aspects and advantages of the invention will become apparent from the following more detailed description, taken in conjunction with the accompanying drawing.

BRIEF DESCRIPTION OF THE DRAWING

The single drawing view is a schematic diagram of a power amplifier circuit employing predistortion in accordance with the invention.

DESCRIPTION OF THE PREFERRED EMBODIMENT OF THE INVENTION

As shown in the drawing for purposes of illustration, the present invention pertains to a predistortion technique for use in power amplifiers for radio-frequency (RF) transmitters. A power amplifier is subject to unwanted distortion in both the phase and amplitude of its output when operated outside its generally linear characteristic that governs operation at relatively low input and output powers. Predistortion of the input signal has been proposed as a solution extending the linear region of operation of an amplifier. U.S. Pat. No. 5,867,065 discloses a predistortion technique that compares input and output digital signals at baseband frequencies. This approach requires complex supporting circuitry, including local oscillators, a downconverter and a demodulator to convert the amplifier RF output signal back to baseband for comparison with the input signals.

In accordance with the present invention, an RF power amplifier is subject to predistortion directly, at the frequency of operation of the amplifier. Conversion of the amplifier output to a different frequency is avoided and the resulting circuitry is relatively simple. An additional advantage is that, because the predistortion is performed at the RF (carrier) level, the technique is completely independent of the type of modulation that is employed before input signals reach the amplifier. Still another advantage is that the predistortion technique adapts automatically to varying amplifier parameters caused, for example, by component aging and changes in environmental conditions.

As shown in the drawing, the circuitry of the invention is connected to an RF power amplifier 10 which has an RF input, shown by the arrow 12 on the left side of the drawing, and an RF output 14. The RF input signal is subject to some type of modulation, as indicated generally by box 16. The specific type of modulation employed is completely irrelevant to the present invention. The signal emerging from the modulator 16 on line 18 is an RF signal at the frequency of a carrier that will be used, after amplification, to transmit the signal to a remote location. Before input to the amplifier 10, the RF signal on line 18 is subject to processing by a predistorter 20, which modifies the amplitude and phase of the RF signal. Then the predistorted signal, on line 22, is input to the power amplifier 10.

The RF output signal on line 14 is sampled by a directional coupler 24 and transmitted over line 26 to a phase discriminator 30. The input signal to the power amplifier 10, on line 22 is sampled by a second directional coupler 32, and transmitted over a line 34 to another directional coupler 36, which again splits the input sample. One sampled portion of the input power signal is transmitted over line 38 from the third directional coupler 36 to the phase discriminator 30. Thus the discriminator 30 receives on lines 38 and 26 two input signals to be compared in amplitude and phase. In some phase discriminators, these inputs are referred to as the reference input and the test input, respectively.

The directional coupler 24 in the RF output line 14 is designed to attenuate the RF output signal and to reverse the gain of the amplifier 10. In other words, the sampled RF input and output signals should, if there were no amplifier distortion, be exactly the same in amplitude and phase. The phase discriminator 30 compares the amplifier RF input and output signals provided on lines 38 and 26, respectively, and generates on output lines 50 and 52, respectively, I and Q output signals representing a vector that is indicative, at any instant in time, of the difference between the RF input and output signals.

The phase discriminator 30 may be any conventional component for comparing two input signals of the same frequency and generating outputs containing amplitude and phase difference information For example, a Series 20750 phase comparator manufactured by Anaren Microwave, Inc., East Syracuse, N.Y., would be suitable. The Series 20750 phase comparator may be configured to produce I and Q outputs that are proportional to the product of the input signal magnitudes and to the cosine and sine, respectively, of the difference in phase angles of the two input signals. Therefore, the I and Q outputs from this device contain magnitude difference information only indirectly, but the magnitude difference can be computed if one of the input signals is independently known, as discussed further below.

The I and Q output signals on lines 50 and 52 are applied in parallel to an analog-to-digital (A/D) converter 60. Also applied, as a third parallel input to the converter 60, is a sample of the RF input signal, obtained from the third directional coupler 36, over line 62. Therefore, the A/D converter 60 produces three digitized outputs on a periodic basis: the I and Q output signals derived from the phase discriminator 30, on lines 64 and 66, and the RF amplifier input signal, on line 68.

From these three quantities, a computation module shown as block 70 derives values for gain compression and the output phase. Gain compression, or compressed gain, is the reduction in amplifier gain caused by distortion. It is usually expressed as a ratio of the actual gain when there is a large signal causing distortion, to the gain obtained when amplifying a small signal in the linear range of the amplifier. Since the measured output signal, $P_{OUT}$, has been normalized or scaled to be comparable with the input signal $P_{IN}$, the ratio $P_{OUT}/P_{IN}$ provides a measure of the compression. When the ratio is unity, there is no gain compression and the amplifier is operating in its linear region. The scalar value of $P_{OUT}$ may, of course, be determined from the value of $P_{IN}$ and the I and Q components of the difference between $P_{IN}$ and $P_{OUT}$. Then the compression is easily determined. Similarly, the phase angle of the RF output signal $P_{OUT}$ may also be determined from the value of $P_{IN}$ and the I and Q components of the difference between $P_{IN}$ and $P_{OUT}$.

If the I and Q outputs from the phase discriminator 30 are proportional to the product of $P_{IN}$ and $P_{OUT}$, rather than to the difference between them, then the scalar magnitude of $P_{OUT}$ must first be computed from the I and Q values and the value of $P_{IN}$, which is independently known from its input on line 68 to the computation block 70. The ratio $P_{OUT}/P_{IN}$ then provides a measure of the compression, as discussed above.

The values of compression and phase output are stored, as indicated by lines 72 and 74, together with the corresponding value of $P_{IN}$, as indicated by line 76, in a selected lookup table 78. More precisely, the compression and phase output are stored as running averages for each value of $P_{IN}$ that is encountered. The running averages for compression and phase output may be computed for all recorded instances of a specific $P_{IN}$ value, or, more preferably, the averages may be computed for the last n instances, where n is a preselected number. Thus the lookup table 78 contains an estimate of the values of gain compression and output phase angle for each of a large number of instances of each of the $P_{IN}$ values. Further, these stored running averages will automatically adjust when circuit parameters of the amplifier change with time or temperature.

The lookup table 78 may be one of a set of such tables, each table in the set being used for a different operating frequency of the amplifier 10. When the amplifier is switched to a different carrier frequency to accommodate, for example, multiple communication channels operating at different carrier frequencies, storage and retrieval paths to and from the lookup table are adjusted to access a different parallel table of the set of lookup tables 78.

The function of the predistorter 20 is to adjust the amplitude and phase of the RF input signal in accordance with the accumulated history of gain compression and output phase for each value of $P_{IN}$. The predistorter 20 addresses the appropriate lookup table 78 using the current value of $P_{IN}$ and retrieves the corresponding running averages for compression and output phase. These values are applied to the input signal in a negative sense. If compression is stored in the form of a ratio $P_{OUT}/P_{IN}$ then $P_{IN}$ is predistorted by multiplying it by the inverse ratio $P_{IN}/P_{OUT}$, and by phase shifting by the amount of the output phase angle retrieved from the lookup table 78.

It will be appreciated from the foregoing that the predistorter 20 effectively compensates for any distortion due to operation of the amplifier 10 out of its linear region. The lookup table 78 accumulates statistical averages of the distortion parameters that have obtained in the past for each value of input power. Because the distortion parameters stored in the lookup table 78 reflect the distortion behavior of the amplifier 10, the parameters automatically adjust as the characteristics of the amplifier change slowly because of temperature or aging effects. It will also be appreciated that, although a specific embodiment of the invention has been described in detail for purposes of illustration, various modifications may be made without departing from the spirit and scope of the invention. Accordingly, the invention should not be limited except as by the appended claims.

What is claimed is:

1. Apparatus for predistorting an input signal applied to a radio frequency (RF) power amplifier, the apparatus comprising:
   an RF phase discriminator, for generating output signals indicative of phase and amplitude differences between two input signals;
   means for coupling a portion of an RF amplifier input as a first input signal to the RF phase discriminator;
   means for coupling a portion of an RF amplifier output as a second input signal to the RF phase discriminator, wherein the coupled portion of the RF amplifier output is scaled to be comparable with the RF amplifier input;
   an analog-to-digital converter for converting difference signals generated by the RF phase discriminator to digital form;
   a computation module for deriving from the difference signals corresponding values of gain compression and RF amplifier output phase;
   means for coupling a portion of the RF amplifier input to the analog-to-digital converter, to derive RF amplifier input values in digital form;
   a digital memory, for storing in association with each other, values of RF amplifier input, gain compression and RF amplifier output phase; and
   an amplifier predistorter, for adjusting the amplitude and phase of the RF amplifier input based on the stored values of gain compression and RF amplifier output phase, to compensate for distortion in the RF amplifier.

2. Apparatus as defined in claim 1, wherein the RF phase discriminator comprises:
   first and second input terminals for receiving the first and second inputs derived from the amplifier input and output signals, respectively; and
   first and second output terminals for outputting in-phase (I) and quadrature (Q) output signals containing phase difference and amplitude difference information.

3. Apparatus as defined in claim 2, wherein the analog-to-digital converter receives as parallel inputs the I component and Q output signals and generates the digital equivalents of these difference signals.

4. Apparatus as defined in claim 3, and further comprising:
   means for coupling a portion of the RF amplifier input to a third parallel input of the analog-to-digital converter, which generates the digital equivalent of the RF amplifier input.

5. Apparatus as defined in claim 4, wherein:
   the digital memory comprises a lookup table having data fields for storing RF amplifier input values and corresponding values of amplifier gain compression and amplifier output phase; and
   the amplifier predistorter includes means for accessing the lookup table based on a current value of RF amplifier input, and retrieving the corresponding values of amplifier gain compression and amplifier output phase.

6. Apparatus as defined in claim 5, wherein the values of amplifier gain compression and amplifier output phase are stored in the lookup table as running averages, whereby any changes in amplifier distortion characteristics are automatically reflected in the lookup table and used to apply predistortion.

7. Apparatus as defined in claim 5, wherein the digital memory comprises additional lookup tables, each corresponding to a different RF amplifier operating frequency.

8. A method for predistorting an input signal applied to a radio frequency (RF) power amplifier, to compensate for amplifier distortion, the method comprising the steps of:
   coupling a portion of an RF amplifier input as a first input signal to an RF phase discriminator;
   coupling a portion of an RF amplifier output as a second input signal to the RF phase discriminator, wherein this coupling step includes scaling the RF amplifier output to be comparable with the RF amplifier input;
   generating, in the RF phase discriminator, output signals indicative of phase and amplitude differences between the first and second input signals;
   converting, in an analog-to-digital converter, the RF phase discriminator output difference signals from analog to digital form;
   computing from the digital difference signals corresponding values of RF amplifier gain compression and RF amplifier output phase;
   storing, in association with each other in a lookup table, values of RF amplifier input, amplifier gain compression and amplifier output phase; and
   predistorting the RF amplifier input in amplitude and phase, based on stored values of gain compression and amplifier output phase associated with a desired value of RF amplifier input.

9. A method as defined in claim 8, wherein the step of converting the difference signals to digital form comprises receiving as parallel inputs to the analog-to-digital converter in-phase (I) and quadrature (Q) difference signals from the RF phase discriminator and generating the digital equivalents of these difference signals.

10. A method as defined in claim 9, and further comprising:
    coupling a portion of the RF amplifier input to a third parallel input of the analog-to-digital converter; and
    generating the digital equivalent of the RF amplifier input.

11. A method as defined in claim 10, wherein:

the storing step comprises storing in the lookup table data values for the RF amplifier inputs and corresponding values of amplifier gain compression and amplifier output phase; and the predistorting step includes accessing the lookup table based on a current value of RF amplifier input, and retrieving the corresponding values of amplifier gain compression and amplifier output phase.

12. A method as defined in claim 11, wherein the storing step stores running averages of the amplifier gain compression and amplifier output phase.

13. A method as defined in claim 11, wherein the storing step comprises additional lookup tables, each corresponding to a different RF amplifier operating frequency, and wherein the storing step includes selecting a lookup table based on RF amplifier frequency, and storing in the selected lookup table values for RF amplifier input, amplifier gain compression and amplifier output phase.

14. A method as defined in claim 8, wherein the step of predistorting comprises automatically compensating for changes in amplifier characteristics that cause corresponding changes in amplifier distortion.

* * * * *